(12) United States Patent
Chang et al.

(10) Patent No.: US 6,926,590 B1
(45) Date of Patent: Aug. 9, 2005

(54) METHOD OF IMPROVING DEVICE PERFORMANCE

(75) Inventors: Kuo Hui Chang, Taoyuan (TW); Shing Long Lee, Hsinchu (TW); Ching Lang Yen, Taichung (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/877,181

(22) Filed: Jun. 25, 2004

(51) Int. Cl.[7] ............................................. H01L 21/00
(52) U.S. Cl. ........................... 451/41; 451/54; 438/759
(58) Field of Search ............................. 438/759, 760, 438/778, 253, 254, 396; 451/36, 37, 41, 42, 451/54

(56) References Cited

U.S. PATENT DOCUMENTS

| | | | |
|---|---|---|---|
| 5,907,790 A | * | 5/1999 | Kellam .................... 438/666 |
| 6,192,899 B1 | * | 2/2001 | Li et al. .................... 134/1.3 |
| 2004/0074526 A1 | * | 4/2004 | Aoki et al. ................. 134/36 |
| 2004/0166596 A1 | * | 8/2004 | Sashida et al. ............. 438/3 |

* cited by examiner

Primary Examiner—Jacob K. Ackun, Jr.
(74) Attorney, Agent, or Firm—Tung & Associates

(57) ABSTRACT

A method of improving the yield and performance of IC devices fabricated on a semiconductor wafer is disclosed. The method includes fabricating via plugs in via openings provided in an intermetal dielectric (IMD) layer on a wafer, subjecting the wafer to CMP to isolate the via plugs, immersing and soaking the wafer in deionized (DI) water, and drying the wafer using isopropyl alcohol, typically in a Marangoni-type dryer. The Marangoni IPA drying step prevents the formation of static electricity on the wafer, and thus, prevents the adherence of small charged particles to the wafer. As a result, the yield of IC devices fabricated on the wafer, as well as the performance of the devices, is enhanced.

23 Claims, 3 Drawing Sheets

METHOD OF IMPROVING DEVICE PERFORMANCE

FIELD OF THE INVENTION

The present invention relates to processes for enhancing performance of IC (integrated circuit) devices fabricated on a semiconductor wafer by removing particulate contaminants and surface charges from the wafer during fabrication. More particularly, the present invention relates to a process for enhancing IC device performance by removing particulate contaminants and surface charges from tungsten plugs on a wafer by subjecting the plugs to CMP (chemical mechanical planarization), deionized water rinsing and IPA (isopropyl alcohol) drying steps.

BACKGROUND OF THE INVENTION

In the fabrication process for semiconductor devices, numerous fabrication steps, as many as several hundred, must be executed on a silicon wafer in order to complete integrated circuits on the wafer. These steps typically include sequential deposition of conductive and insulative layers on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove material from one or more conducting layers from the areas not covered by the mask, thereby etching the conducting layer or layers in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

The numerous processing steps outlined above are used to cumulatively apply multiple electrically conductive and insulative layers on the wafer and pattern the layers to form the circuits. Additional techniques, such as dual damascene processes, are used to form conductive vias which establish electrical contact between vertically-spaced conductive lines or layers in the circuits. Tungsten plugs are frequently formed in via openings to establish electrical communication between conductive layers separated by an insulating layer. The finished semiconductor product includes microelectronic devices including transistors, capacitors and resistors that form the integrated circuits on each of multiple die on a single wafer.

Since the processing of silicon wafers requires extreme cleanliness in the processing environment to minimize the presence of contaminating particles or films, the surface of the silicon wafer is frequently cleaned after each processing step. For instance, the wafer surface is cleaned after the deposition of a surface coating layer such as oxide or after the formation of a circuit by a processing step such as etching. A frequently-used method for cleaning the wafer surface is a wet scrubbing method.

In cleaning a wafer surface by a wet scrubbing method, a wafer is rotated at a high speed, i.e., at least about 200 RPM and preferably, about 1,000 RPM, simultaneously with a jet of high-pressure deionized water sprayed on top. The water jet is normally sprayed at a pressure of about 2,000–3,000 psi. The water movement on top of the wafer surface displaces any contaminating particles that are lodged on the wafer surface.

One limitation of the wafer jet scrubbing method is that the process only moves particles from side to side in openings, such as oxide windows, without removing the particle. Furthermore, as the image size decreases, it becomes more difficult for water to reach the particles in openings because of increased surface tension.

It has also been noted that in a water jet scrubbing process conducted on a silicon wafer that is coated with an insulating material, i.e., an oxide layer as an inter-metal dielectric layer, some regions of the film are damaged at the wafer center by the cumulated stress from the water jet when the aperture size of the jet nozzle is too large or is distorted. The damaged film can be identified by a KLA scan, even though a large number of wafers must be tested since the probability of such damage is only about 10–30%.

In a jet-scrubbing process, a wafer is normally positioned on a wafer platform which is typically rotatably mounted on a wafer stage. The wafer platform rotates the wafer at a predetermined rotational speed, which may be between typically about 200 RPM and about 2,000 RPM. Simultaneously, a water jet of de-ionized water is ejected onto the upper surface of the rotating wafer from a nozzle opening in the nozzle. The water jet has a water pressure of typically about 50 $kg/cm^2$.

As it strikes the surface of the wafer at an angle of typically about 45°, the water jet is scanned along a top of the wafer surface by a lateral sweeping motion of the water jet nozzle to define a generally curved or arcuate trace which normally traverses the center of the wafer. The surface of the wafer is scanned by the water jet at least once, and preferably, several times. Centrifugal force acting on the water flow on the surface of the wafer due to the rotating wafer platform and wafer removes contaminating particles or films from the surface of the wafer. Horizontal movement of the wafer stage beneath the water jet nozzle during the scrubbing process provides a more uniform dispersement of the sprayed water along the entire surface of the disc. After completion of the jet-scrubbing process, the wafer is subjected to a spin-drying step in which the wafer is rotated and clean dry air (CDA) is blown against the wafer surface.

In the formation of tungsten plugs as metal interconnects on a wafer, an intermetal dielectric (IMD) layer is deposited on conductive metal lines previously etched from a metal layer on the wafer. Via openings are etched through the IMD layer, followed by the deposition of electrically-conductive metal via plugs, typically tungsten, in the via openings. A metal layer remains on the upper surface of the IMD layer after formation of the via plugs. This metal layer is removed by CMP prior to further processing. Upon completion of the CMP step, the upper surface IMD layer is exposed. The conventional process for cleaning the wafer after the CMP step involves subjecting the wafer to jet-scrubbing, followed by spin-drying. High-speed rotation of the wafer during the spin-drying step causes electrostatic charges to accumulate on the wafer. Consequently, electrically-charged particles adhere to the wafer and must be removed prior to further fabrication of the IC devices on the wafer.

In a jet-scrubbing process, the cleaning efficiency of the water jet ejected onto the wafer depends on various factors including the pressure and size of the water jet, as well as the scan density of the water jet on the wafer. It is well-known that ejecting a water jet of high scan density onto the surface of a wafer effectively removes particles from the wafer. However, in cases in which the jet-scrubbing process is used to clean via plugs after the plugs have been subjected to CMP, it has been found that jet-scrubbing of the wafer is inadequate to remove small particles and electrostatic charges from the exposed surfaces of the intermetal dielectric (IMD) layer and via plugs. This frequently results in the formation of a layer having a high electrical resistance on the exposed portions of the via plugs.

It has been found that subjecting via plugs on a wafer to cleaning by immersion or soaking the wafer in deionized (DI) water, followed by drying of the wafer using isopropyl alcohol (IPA), is effective in removing both particles and surface electrostatic charges from the wafer. This results in a via Rc (electrical resistance) reduction and yield improvement of greater than 1% in the finished IC devices. Accordingly, a method of improving IC device performance by cleaning via plugs on a wafer using DI water immersion or soaking, followed by IPA drying, is needed.

An object of the present invention is to provide a method of improving the performance and yield of IC devices on a semiconductor wafer.

Another object of the present invention is to provide a method of improving the performance and yield of IC devices on a wafer by thoroughly removing particles and electrostatic charges from the wafer after a CMP process.

Still another object of the present invention is to provide a method of improving the performance and yield of IC devices on a wafer which includes fabricating via plugs on the wafer, isolating the via plugs using CMP, soaking the wafer by immersing the wafer in deionized water, and subjecting the wafer to a drying process using isopropyl alcohol (IPA).

SUMMARY OF THE INVENTION

These and other objects and advantages are provided in a method of improving the yield and performance of IC devices fabricated on a semiconductor wafer. The method includes fabricating via plugs in via openings provided in an intermetal dielectric (IMD) layer on a wafer, subjecting the wafer to CMP to isolate the via plugs, immersing and soaking the wafer in deionized (DI) water, and drying the wafer using isopropyl alcohol, typically in a Marangoni-type dryer. The Marangoni IPA drying step prevents the formation of static electricity on the wafer, and thus, prevents the adherence of small charged particles to the wafer. As a result, the yield of IC devices fabricated on the wafer, as well as the performance of the devices, is enhanced.

BRIEF DESCRIPTION OF THE DRAWINGS

The invention will now be described, by way of example, with reference to the accompanying drawings, in which.

DETAILED DESCRIPTION OF THE INVENTION

The present invention contemplates a method of improving the yield and performance of IC devices fabricated on a semiconductor wafer. The method includes fabricating via plugs in via openings extending into an intermetal dielectric (IMD) layer deposited on a wafer; subjecting the wafer to chemical mechanical planarization (CMP) to remove a metal layer from the surface of the IMD layer and isolate the via plugs; cleaning the wafer by immersing and soaking the wafer in deionized (DI) water; and drying the wafer using isopropyl alcohol, typically in a Marangoni-type dryer. The IPA drying step removes any static electricity and charged particles which accumulate on the wafer after the CMP step. Consequently, the yield and electrical performance of IC devices fabricated on the wafer is enhanced.

Figure 1A:
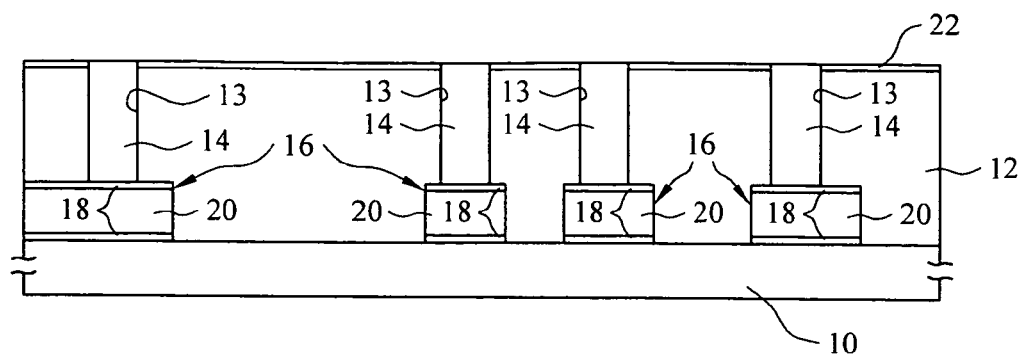
FIG. 1A is a cross-sectional view of a wafer with multiple via plugs fabricated thereon, illustrating a metal layer deposited on an intermetal dielectric (IMD) layer according to the method of the present invention.

Referring initially to FIG. 1A, a semiconductor wafer 10 having an IMD layer 12 deposited thereon is shown. Capacitors 16 are fabricated in the IMD layer 12 using etching and deposition techniques which are known by those skilled in the art. Each of the capacitors 16 includes a pair of spaced-apart metal conductive layers 18 which are separated by a dielectric layer 20.

In the fabrication of IC devices on the wafer 10, via openings 13 are etched through the IMD layer 12, and via plugs 14, typically tungsten, are formed in the via openings 13. Each via plug 14 contacts the upper conductive layer 18 of each capacitor 16. After formation of the via plugs 14, a metal layer 22, which is typically tungsten, remains on the upper surface of the IMD layer 12. The metal layer 22 is removed prior to further fabrication of the IC devices on the wafer 10. In the finished IC device, the via plugs 14 establish electrical communication between each capacitor 16 and higher-order IC device features to be subsequently fabricated on the wafer 10. It is understood that the capacitors 16 are illustrative only and the IMD layer 12 may include any type of device features, including transistors and resistors, for example, provided in electrical contact with the via plugs 14 instead of or in addition to the capacitors 16.

Figure 1B:
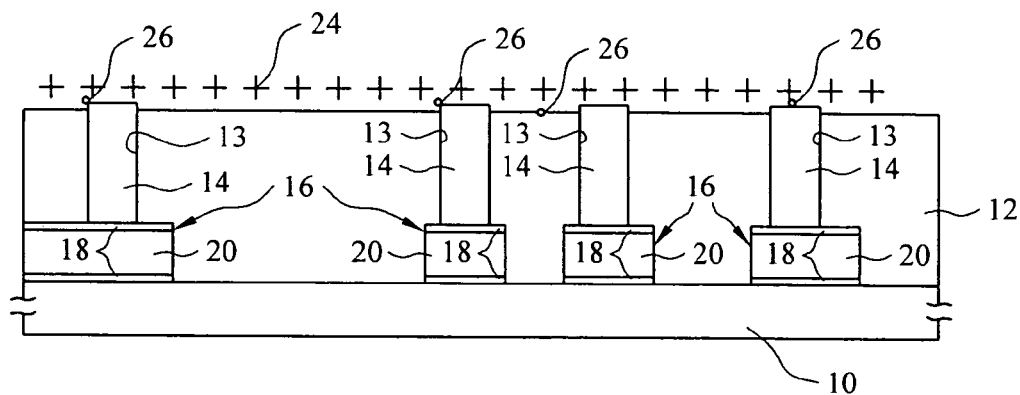
FIG. 1B is a cross-sectional view of a wafer with multiple via plugs fabricated thereon, illustrating an accumulation of electrostatic charges and particles on the wafer after the CMP step of the present invention.
Figure 2A:
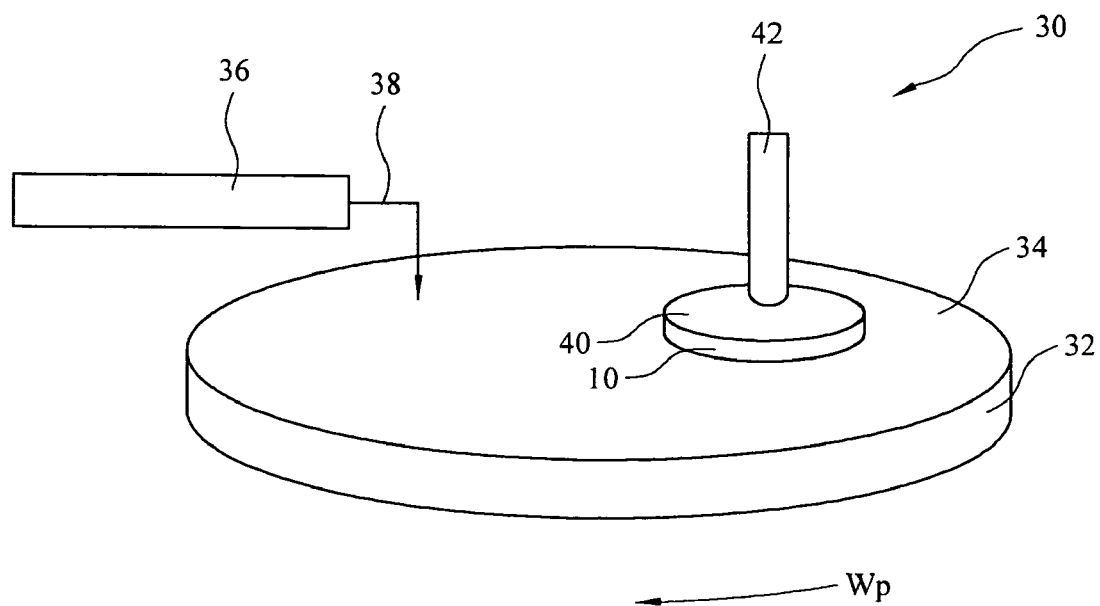
FIG. 2A is a schematic perspective view of a CMP apparatus, illustrating chemical mechanical planarization of a wafer according to the method of the present invention.

Referring next to FIGS. 1B and 2A, after fabrication of the via plugs 14, the wafer 10 is subjected to chemical mechanical planarization (CMP) to remove the metal layer 22 from the upper surface of the IMD layer 12 and electrically isolate the via plugs 14 from each other. This can be accomplished using a conventional CMP apparatus 30, which is shown schematically in FIG. 2A. The conventional CMP apparatus 30 includes a rotatable platen 32 fitted with a polishing pad 34. A slurry dispensing arm 36 extends over the polishing pad 34 to dispense polishing slurry 38 thereon. The CMP apparatus 30 further includes a rotatable wafer carrier 40 which is mounted on a shaft 42 above the polishing pad 34 and supports the wafer 10 during the CMP process.

During the CMP process, the wafer carrier 40 presses and rotates the wafer 10 against the polishing pad 34 as the polishing pad 34 is rotated by the platen 40. Simultaneously, the slurry dispensing arm 36 dispenses polishing slurry onto the polishing pad 34. The rotating action of the polishing pad 34 removes the metal layer 22 from the upper surface of the IMD layer 12 and electrically isolates the via plugs 14 from each other, as shown in FIG. 1B.

Upon completion of the CMP process, the polished wafer 10 is removed from the wafer carrier 40. Electrostatic charges 24 (FIG. 1B) tend to accumulate on the exposed surface of the IMD layer 12, as well as on the exposed surfaces of the electrically-isolated via plugs 14. These electrostatic charges 24 attract small particles 26 which have an electrical charge that is opposite that of the electrostatic charges 24. Unless removed, the charges 24 and particles 26 form a layer (not shown) of high electrical resistance on the exposed surfaces of the via plugs 14, thereby increasing the Rc of the via plugs 14. Therefore, the particles 26 which accumulate on the IMD layer 12 and via plugs 14 and must be removed prior to further fabrication of the IC circuit devices on the wafer 10.

Figure 1C:
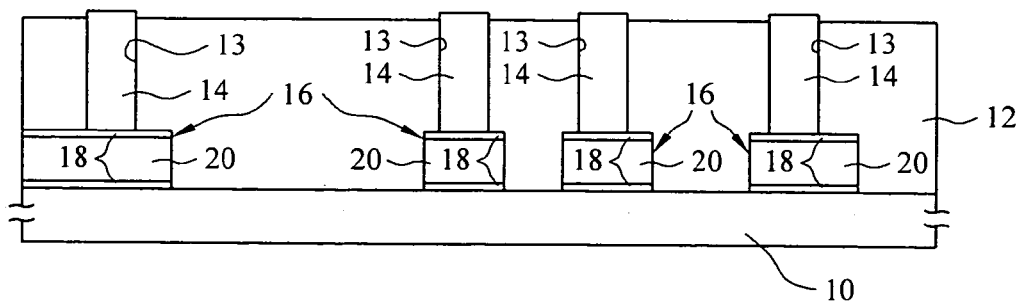
FIG. 1C is a cross-sectional view of a wafer with multiple via plugs fabricated thereon, with the electrostatic charges and particles removed from the wafer according to the method of the present invention.
Figure 2B:
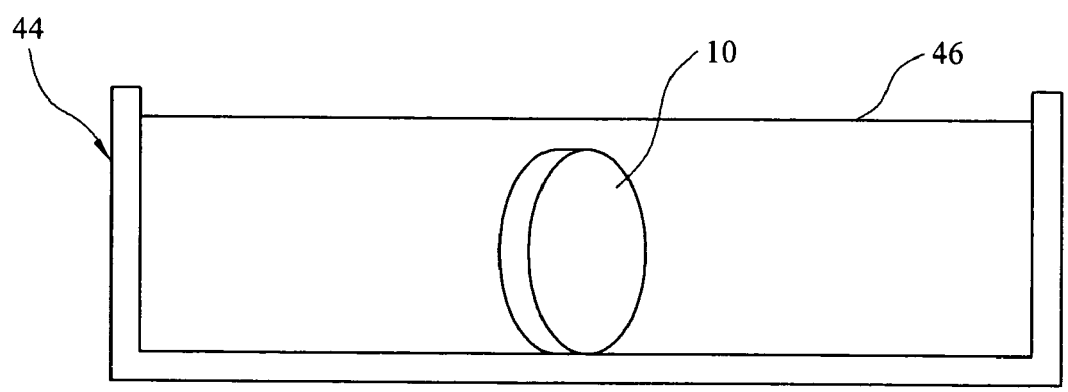
FIG. 2B is a schematic view of a rinse tank, illustrating immersion cleaning of a wafer after CMP according to the method of the present invention.

Referring next to FIGS. 1C and 2B, after completion of the CMP step, the wafer 40 is immersed in deionized water 46 contained in a rinse tank 44. Preferably, the wafer 10 is immersed in the deionized water 46 for a period of at least 1 minute. This immersion-cleaning step removes metal particles, which remain on the IMD layer 12 and tungsten plugs 14 after the CMP step. Furthermore, the immersion-cleaning step neutralizes the electrostatic charges 24 and removes the charged particles 26 from the IMD layer 12 and via plugs 14, as shown in FIG. 1C.

Figure 2C:
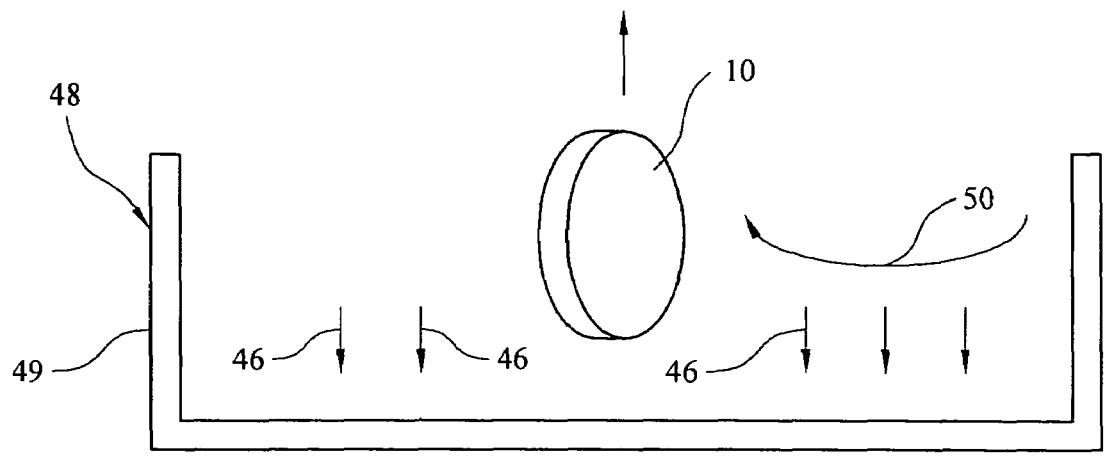
FIG. 2C is a schematic view of a Marangoni-type dryer, illustrating drying of a wafer after immersion cleaning according to the method of the present invention.

Referring next to FIG. 2C, the wafer 10 is next subjected to a drying step, which is typically carried out in a Marangoni dryer 48 using isopropyl alcohol (IPA) 50. In a typical Marangoni-type IPA drying method, the wet substrate 10 is moved into a sealed vessel 49 and placed in the processing region of the vessel. An IPA vapor cloud 50 is generated in a vapor-generating region of the vessel 49 and is directed into the processing region, where it removes water 46 from the wafer 10. The wafer 10 is typically lifted from the processing region of the vessel 49 as the IPA vapor 50 is applied to the wafer 10. This drying technology is highly effective in removing residual water 46 from the wafer 10 and does not generate electrostatic charges 24 (FIG. 1B) which would otherwise attract charged particles 26 to the exposed surfaces of the IMD layer 12 and via plugs 14. Consequently, the exposed surfaces of the IMD layer 12 and via plugs 14 remain substantially free of electrostatic charges 24 and charged particles 26, as shown in FIG. 1C, upon resuming fabrication of the IC devices on the wafer 10.

Figure 3:
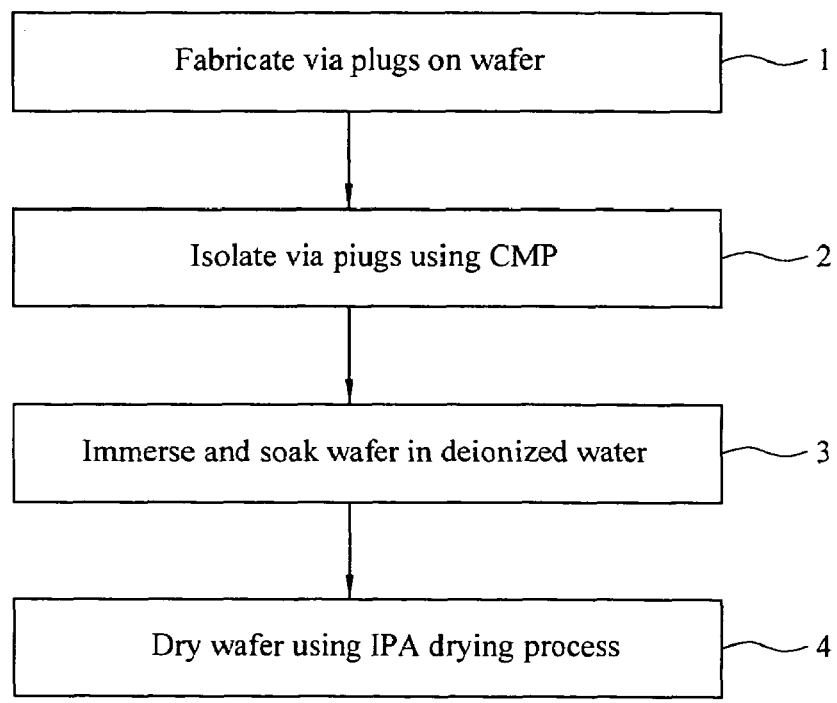
FIG. 3 is a flow diagram which summarizes sequential process steps carried out according to the method of the present invention.

FIG. 3 summarizes sequential process steps carried out according to the method of the present invention. In step 1, via plugs are fabricated in an IMD layer on a wafer. In step 2, in a CMP process, which may be conventional, the via plugs are electrically isolated from each other by removing a metal layer which remains on the surface of the IMD layer after formation of the via plugs. In step 3, the wafer is immersed and soaked in deionized water. In step 4, the wafer is dried using vaporized IPA, typically in a Marangoni-type drying process.

It will be appreciated by those skilled in the art that via plugs subjected to the method of the present invention exhibit a stabilized and reduced via Rc (electrical resistance), leading to enhanced performance of IC circuit devices ultimately fabricated on the wafer. Furthermore, the via Rc reduction is directly proportional to the time the wafer remains immersed in the rinse tank in the immersion cleaning step. Moreover, the method enhances the yield of devices fabricated on a wafer by more than 1%.

While the preferred embodiments of the invention have been described above, it will be recognized and understood that various modifications can be made in the invention and the appended claims are intended to cover all such modifications which may fall within the spirit and scope of the invention.

What is claimed is:

1. A method of improving performance and yield of integrated circuit devices, comprising:
   providing a substrate having via plugs in a top surface;
   performing a CMP process on said substrate;
   rinsing said via plugs; and
   drying said via plugs using vaporized isopropyl alcohol.

2. The method of claim 1 wherein said rinsing said via plugs comprises providing deionized water and immersing said substrate in said deionized water.

3. The method of claim 2 wherein a temperature of said deionized water is between 25° C. and 65° C.

4. The method of claim 1 wherein said substrate further comprising at least one conductive layer on said top surface.

5. The method of claim 1 wherein said substrate further comprising at least one dielectric layer on said top surface.

6. The method of claim 1 wherein said step of drying said via plugs comprises providing a Marangoni dryer, placing said substrate in said Marangoni dryer and subjecting said via plugs to said vaporized isopropyl alcohol.

7. The method of claim 6 wherein said rinsing said via plugs comprises providing deionized water and immersing said substrate in said deionized water.

8. The method of claim 1 wherein each of said via plugs comprises tungsten.

9. The method of claim 8 wherein said rinsing said via plugs comprises providing deionized water and immersing said substrate in said deionized water.

10. The method of claim 8 wherein said drying said via plugs comprises providing a Marangoni dryer, placing said substrate in said Marangoni dryer and subjecting said via plugs to said vaporized isopropyl alcohol.

11. The method of claim 10 wherein said rinsing said via plugs comprises providing deionized water and immersing said substrate in said deionized water.

12. A method of improving performance and yield of integrated circuit devices having a dielectric layer on a substrate and via plugs in said dielectric layer, comprising:
   providing a metal layer on said dielectric layer and said via plugs;
   performing a CMP process on said substrate to isolate said via plugs;
   rinsing said substrate; and
   drying said substrate by exposing said substrate to vaporized isopropyl alcohol.

13. The method of claim 12 wherein said rinsing said via plugs comprises providing deionized water and immersing said substrate in said deionized water.

14. The method of claim 12 wherein said drying said via plugs comprises providing a Marangoni dryer, placing said substrate in said Marangoni dryer and subjecting said via plugs to said vaporized isopropyl alcohol.

15. The method of claim 14 wherein said rinsing said via plugs comprises providing deionized water and immersing said substrate in said deionized water.

16. The method of claim 12 wherein each of said via plugs comprises tungsten.

17. The method of claim 16 wherein said step of rinsing said via plugs comprises providing deionized water and immersing said substrate in said deionized water.

18. The method of claim 16 wherein said drying said via plugs comprises providing a Marangoni dryer, placing said substrate in said Marangoni dryer and subjecting said via plugs to said vaporized isopropyl alcohol.

19. The method of claim 18 wherein said rinsing said via plugs comprises providing deionized water and immersing said substrate in said deionized water.

20. A method of improving performance and yield of integrated circuit devices having a dielectric layer on a substrate and via plugs in said dielectric layer, comprising:
providing a metal layer on said dielectric layer and said via plugs;
isolating said via plugs by removing said metal layer from said dielectric layer by subjecting said metal layer to chemical mechanical planarization;
rinsing said substrate; and
drying said substrate by exposing said substrate to vaporized isopropyl alcohol.

21. The method of claim 20 wherein said rinsing said via plugs comprises providing deionized water and immersing said substrate in said deionized water.

22. The method of claim 21 wherein said drying said via plugs comprises providing a Marangoni dryer, placing said substrate in said Marangoni dryer and subjecting said via plugs to said vaporized isopropyl alcohol.

23. The method of claim 22 wherein each of said via plugs comprises tungsten.

* * * * *